United States Patent [19]

Sobhani

[11] Patent Number: 5,572,407
[45] Date of Patent: Nov. 5, 1996

[54] APPARATUS FOR INTERCONNECTING AN INTEGRATED CIRCUIT DEVICE TO A MULTILAYER PRINTED WIRING BOARD

[75] Inventor: Mohi Sobhani, Encino, Calif.

[73] Assignee: Hughes Aircraft Company, Los Angeles, Calif.

[21] Appl. No.: 556,670

[22] Filed: Nov. 13, 1995

Related U.S. Application Data

[63] Continuation of Ser. No. 279,756, Jul. 22, 1994, abandoned.

[51] Int. Cl.$^6$ .................................................. H05K 7/20
[52] U.S. Cl. ............................. 361/719; 62/3.7; 165/80.4; 361/776; 361/789; 439/73
[58] Field of Search .............................. 361/688, 689, 361/699, 701, 702, 704, 707, 718, 709–711, 719, 749, 760, 764, 768, 776, 789; 439/67–73, 77, 329, 485, 487, 492, 493, 499; 165/80.2, 80.4, 104.33; 257/668, 675, 707, 713, 714; 62/3.3, 3.7, 259.2

[56] References Cited

U.S. PATENT DOCUMENTS

| | | | |
|---|---|---|---|
| 4,279,292 | 7/1981 | Swiatosz | 165/61 |
| 5,155,661 | 10/1992 | Nagesh | 361/704 |
| 5,157,255 | 10/1992 | Kornrumpf | 250/252.1 |
| 5,166,774 | 11/1992 | Banerji et al. | 361/749 |
| 5,200,810 | 4/1993 | Wojnarowski | 361/398 |
| 5,288,235 | 2/1994 | Sobhani | 439/67 |
| 5,317,479 | 5/1994 | Pai | 361/776 |
| 5,343,360 | 8/1994 | Sanwo | 361/707 |
| 5,379,187 | 1/1995 | Lee | 361/707 |
| 5,430,614 | 7/1995 | Difrancesco | 361/785 |

FOREIGN PATENT DOCUMENTS 314857 12/1988 Japan ................................. 361/749

Primary Examiner—Gerald P. Tolin
Attorney, Agent, or Firm—M. E. Lachman; M. W. Sales; W. K. Denson-Low

[57] ABSTRACT

Apparatus for interconnecting an integrated circuit device, such as an infrared device, having a plurality of leads to a multilayer printed wiring board having a plurality of interconnects. The apparatus comprises a flexprint circuit having a plurality of interconnects that are configured to mate with the plurality of interconnects on the printed wiring board. The flexprint circuit has wrinkles formed along its surface that form a spring, and a plurality of printed circuit leads that are coupled between the leads of the integrated circuit device and the interconnects. Fastening members is provided for forcibly interconnecting the respective pluralities of interconnects. Respective ends of the flexprint circuit may be folded so that the interconnects contact the interconnects disposed on the printed wiring board. A thermoelectric cooler may be provided for cooling an infrared integrated circuit device, that is coupled through an opening disposed in the flexprint circuit through which the thermoelectric cooler projects to contact the infrared device.

6 Claims, 1 Drawing Sheet

APPARATUS FOR INTERCONNECTING AN INTEGRATED CIRCUIT DEVICE TO A MULTILAYER PRINTED WIRING BOARD

This is a continuation application Ser. No. 08/279,756, filed Jul. 22, 1994, now abandoned.

BACKGROUND

The present invention relates to integrated circuit interconnection apparatus, and more particularly, to apparatus for interconnecting an infrared or other integrated circuit device to a multilayer printed wiring board.

The assignee of the present invention develops infrared sensors for use in vehicle application, and the like. Heretofore, interconnection of infrared devices, for example, to multilayer printed wiring boards has been achieved by wiring the infrared device using preloaded springs with or without connectors attached thereto. However, this type of interconnection arrangement is labor intensive, is difficult to assemble, and requires an unreliable method to cool the infrared device. Furthermore, the physical interconnection between the infrared device and the multilayer printed wiring board is nonuniform and is expensive, and many pans are required which results in a less than cost effective assembly. Also, in a vehicle environment, the infrared or other integrated circuit device must be packaged to withstand vibration while in operation. Consequently, it would be desirable to have an integrated circuit interconnection apparatus that eliminates the problems of conventional approaches.

Therefore, it is an objective of the present invention to provide for an improved apparatus for interconnecting an infrared or other integrated circuit device to a multilayer printed wiring board.

SUMMARY OF THE INVENTION

In order to meet the above and other objectives, the present invention comprises apparatus for interconnecting an infrared or other integrated circuit device to a multilayer printed wiring board. The apparatus employs a flexprint circuit designed with bumps or dimples for accommodating the interconnection between the infrared or other integrated circuit device and the printed wiring board. The flexprint circuit is wrinkled to form a spring which is able to withstand vibration encountered by the assembly during operation, such as during operation of a vehicle in which the infrared or other integrated circuit device and assembly are used. The flexprint circuit has an opening in which the device is located. This allows the infrared or other integrated circuit device to directly contact a thermoelectric cooler disposed below it.

The apparatus of the present invention eliminates wiring, soldering and spring loading of infrared or other integrated circuit devices to the multilayer printed wiring board. The flexprint circuit has dimples or bumps to provide for pressure-type interconnection between the devices to the multilayer printed wiring board. This allows separation of the device from the multilayer printed wiring board without soldering and desoldering thereof. The wrinkles that are formed in the flexprint circuit allow the infrared device to withstand vibration. The opening in the flexprint circuit allows the device to cool directly with the thermoelectric cooler during operation. Most importantly, from a manufacturing standpoint, no solder, no springs and no connectors are used, which results in a very cost-effective assembly.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
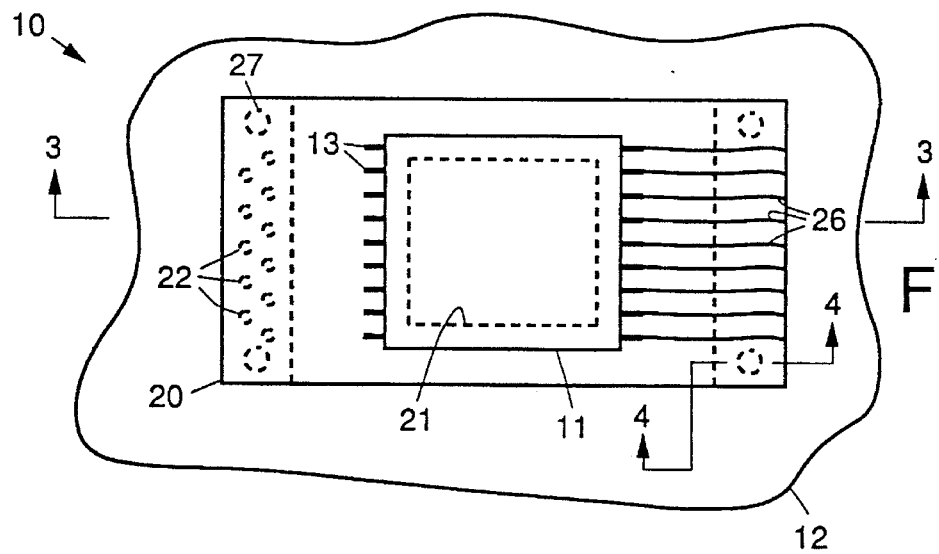
FIG. 1 shows a top view of interconnection apparatus for interconnecting an infrared or other integrated circuit device to a multilayer printed wiring board in accordance with the principles of the present invention.
Figure 2:
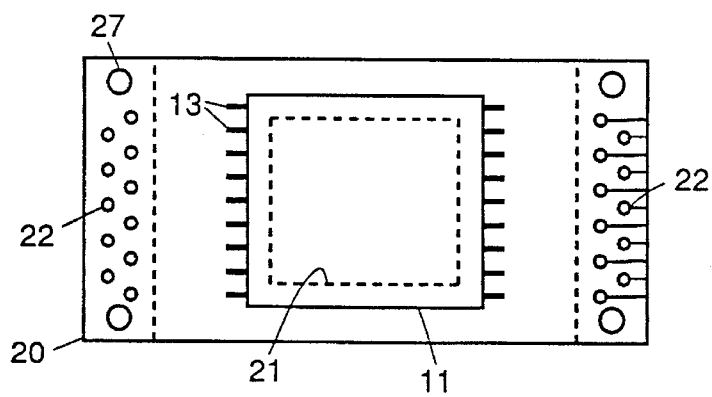
FIG. 2 shows a bottom view of interconnection apparatus of FIG. 1.
Figure 3:
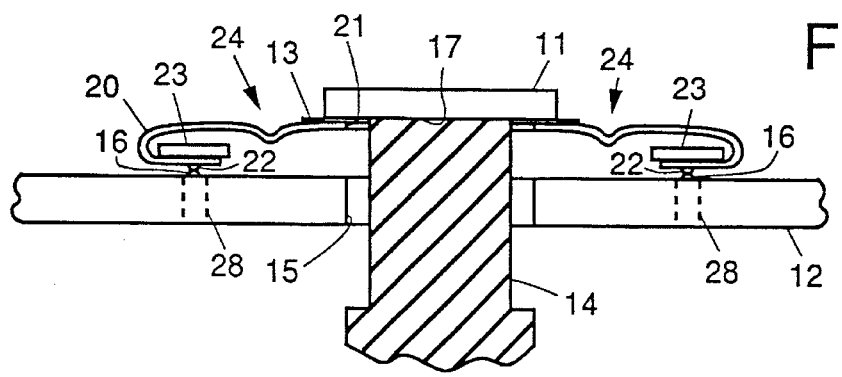
FIG. 3 is a cross sectional side view of the interconnection apparatus taken along the lines 3—3 in FIG. 1.
Figure 4:
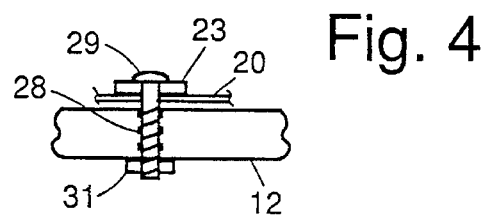
FIG. 4 is a cross sectional side view of the interconnection apparatus taken along the lines 4—4 in FIG. 1.

Referring to the drawing figures, FIG. 1 shows a top view of interconnection apparatus 10 for interconnecting an integrated circuit device 11, such as an infrared device 11, for example, to a multilayer printed wiring board 12 in accordance with the principles of the present invention. FIG. 2 shows a bottom view of interconnection apparatus 10, FIG. 3 is a cross sectional side view of the interconnection apparatus 10 taken along the lines 3—3 in FIG. 1, and FIG. 4 is a cross sectional side view of the interconnection apparatus taken along the lines 4—4 in FIG. 1. The present invention is described with reference to interconnection of an infrared device 11 to a printed wiring board 12, but it is to be understood that the present invention may be employed to interconnect any type of integrated circuit device 11 to the printed wiring board 12.

The multilayer printed wiring board 12 has an opening 15 therein through which a thermoelectric cooler 14 projects that is adapted to contact the infrared device 11 when the interconnection apparatus 10 is used to interconnect the infrared device 11 to the multilayer printed wiring board 12. The thermoelectric cooler 14 is secured to the infrared device 11 by means of a temperature sensitive adhesive or glue 17, for example. The printed wiring board 12 has a plurality of interconnects 16, such as bumps 16 or dimples 16, disposed on its surface that are used to interface to the interconnection apparatus 10. The printed wiring board 12 has a plurality of holes 28 that are used to secure the interconnection apparatus 10 thereto.

The interconnection apparatus 10 is comprised of a flexprint circuit 20 that has an opening 21 disposed therein through which the thermoelectric cooler 14 projects in order to make contact with the infrared device 11. The infrared device 11 is secured to the flexprint circuit 20 by means of adhesive such as epoxy, for example, disposed around its periphery, so that the opening 21 in the flexprint circuit is generally centered on its bottom surface. The infrared device 11 has a plurality of leads 13 or contacts 13, such as is typical of many semiconductor devices.

The flexprint circuit 20 has a plurality of interconnects 22, such as bumps 22 or dimples 22, disposed on its top surface that are configured to mate with the plurality of dimples 16 or bumps 16 on the printed wiring board 12. The flexprint circuit 20 has two wrinkles or folds 24 along its surface on either side of the location of the infrared device 11. The flexprint circuit 20 has a plurality of printed circuit leads 26 that are coupled between the leads 13 of the infrared device and the interconnects 22 at the respective ends of the flexprint circuit 20. Respective ends of the flexprint circuit are wrapped in a "C" shape so that the bumps 22 or dimples 22 disposed on the top surface of the flexprint circuit 20 are in proximity to the bumps 16 or dimples 16 disposed on the surface of the printed wiring board 12. This is shown clearly in FIG. 3.

Two pressure plates 23 or fastening members 23 are provided that are used to force the bumps 22 or dimples 22 on the flexprint circuit 20 an contact the dimples 16 or bumps 16 disposed on the printed wiring board 12. A plurality of holes 27 are provided through the flexprint circuit 20 and the pressure plates 23 to permit securing of the flexprint circuit 20 to the printed wiring board 12 by means of the holes 28. The two pressure plates 23 are secured to the printed wiring board 12 by means of fasteners 29 such as screws 29 (shown in FIG. 4) that are disposed through the plurality of holes 27 and the holes 28 in the printed wiring board 12. The fasteners 29 may be secured into the threaded holes 28 in the printed wiring board 12 or may extend through the printed wiring board 12 and be secured by means of nuts 31 in a conventional manner as is illustrated in FIG. 4.

The bumps 22, 16 or dimples 22, 16 on the flexprint circuit 20 and printed wiring board 12 are used to interconnect the infrared device 11 to the printed wiring board 12. The flexprint circuit 20 is wrinkled 24 to form a spring that is able to withstand vibration encountered by the assembly during operation, such as during operation of a vehicle in which the infrared device 11 is used. The opening 21 in the flexprint circuit 20 allows the infrared device 11 to directly contact the thermoelectric cooler 14 disposed below it.

The interconnection apparatus 10 of the present invention eliminates wiring, soldering and spring loading of an infrared or other integrated circuit device 11 to the multilayer printed wiring board 12. The flexprint circuit 20 has dimples 22 or bumps 22 to provide for pressure-type interconnection between the device 11 and the multilayer printed wiring board 12. This allows separation of the device 11 from the multilayer printed wiring board 20 without soldering and desoldering thereof. The wrinkles 24 that are formed in the flexprint circuit 20 allow the device 11 to withstand vibration. The opening 21 in the flexprint circuit 20 allows the device 11 to cool directly by means of the thermoelectric cooler 14 during operation. Most importantly, from a manufacturing standpoint, no solder, no springs and no connectors are used, which results in a very cost-effective assembly.

Thus there has been described a new and improved apparatus for interconnecting an integrated circuit device, such as an infrared device, to a multilayer printed wiring board. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. Apparatus comprising:

an integrated circuit device having a plurality of leads;

a multilayer printed wiring board having a first plurality of interconnects disposed on its surface; and a flexible circuit having first and second ends and having a second plurality of interconnects wherein said first and second ends of said flexible circuit are each folded under in a C-shape so that said second plurality of interconnects are mated with the first plurality of interconnects on the printed wiring board, said flexible circuit having wrinkles formed along its surface on either side of said integrated circuit device to thereby provide spring that protects said integrated circuit device from vibration, and having a plurality of printed circuit leads having third and fourth ends, wherein said leads are electrically connected at said third ends to the leads of the integrated circuit device and at said fourth ends to the second plurality of interconnects, said integrated circuit device being supported by said flexible circuit; and securing means for forcibly interconnecting the respective pluralities of interconnects.

2. The apparatus of claim 1 wherein the first plurality of interconnects comprise bumps and the second plurality of interconnects comprise dimples.

3. The apparatus of claim 1 wherein the first plurality of interconnects comprise dimples and the second plurality of interconnects comprise bumps.

4. The apparatus of claim 1 wherein the integrated circuit device comprises an infrared device.

5. The apparatus of claim 4 further comprising a thermoelectric cooler for cooling the infrared device, and wherein the flexible circuit has an opening disposed therein through which the thermoelectric cooler projects to contact the device.

6. The apparatus of claim 1 wherein the multilayer printed wiring board has a first plurality of holes therethrough and the flexible circuit has a second plurality of holes therein, and wherein the securing means comprises a plurality of pressure plates secured through the first plurality of holes in the multilayer printed wiring board and the second plurality of holes in the flexible circuit for forcibly interconnecting the first and second plurality of interconnects.

* * * * *